United States Patent [19]

Upton

[11] Patent Number: 4,630,031
[45] Date of Patent: Dec. 16, 1986

[54] PULSE-WIDTH DISCRIMINATING A/D CONVERTER

[75] Inventor: Eric L. Upton, Mesa, Ariz.

[73] Assignee: Motorola, Inc., Schaumburg, Ill.

[21] Appl. No.: 565,445

[22] Filed: Dec. 27, 1983

[51] Int. Cl.$^4$ ............................................ H03K 13/02
[52] U.S. Cl. ............................ 340/347 AD; 328/111;
328/112; 307/234; 340/347 M
[58] Field of Search .... 340/347 AD, 347 M, 347 CC;
324/99 D; 307/234; 328/111, 112

[56] References Cited

U.S. PATENT DOCUMENTS 2,485,821 10/1949 Gloess et al. ............ 340/347 AD X
3,316,547 4/1967 Ammann ...................... 340/347 NT
4,233,525 11/1980 Takahashi et al. .............. 328/112 X
4,336,525 6/1982 Chapple, III ................ 340/347 AD

OTHER PUBLICATIONS

Landee et al, Electronic Designers' Handbook, McGraw-Hill Book Co., Inc., 1957, pp. 20-59 to 20-61.

Primary Examiner—T. J. Sloyan
Attorney, Agent, or Firm—Raymond J. Warren

[57] ABSTRACT

Method and apparatus for converting an analog pulse-width signal into a digital signal through the transmission of the analog signal through a delay loop. The resulting delayed signal is then combined with the original signal in an OR gate providing an output of the combined signals. If the width of the original signal is greater than the delay loop a bit 1 is output for the digital signal and the resulting signal from the OR gate is transmitted to the next stage. If the width of the analog signal is less than or equal to the delay loop a bit of 0 is transmitted as the digital signal and the delayed signal is transmitted to the next stage unchanged.

4 Claims, 4 Drawing Figures

PULSE-WIDTH DISCRIMINATING A/D CONVERTER

BACKGROUND OF THE INVENTION

1. Field of the Invention

The present invention relates, in general, to the field of analog and digital signal processing, and more particularly to a pulse-width discriminating Analog-to-Digital (A/D) converter capable of use in electrical or optical applications.

2. Background of the Invention

Electrical A/D converters are well known in the art. One conventional A/D converter is the flash converter type which encodes an analog signal, S, as one of $2^M$ thresholds. This process requires $2^M - 1$ comparators to determine a digital signal, D, equivalent to signal, S, where M is the number of bits in signal D. If an 8 bit signal D were required $2^8 - 1$ or 255 comparators would be needed, which would cause a great deal of signal processing time delay in the system.

Another conventional A/D converter is referred to as a successive approximation or pipeline A/D converter system. In this system, signal S is compared to a reference signal, R. Signal S is then adjusted (S−R if S≧R, S if S<R) and then compared with signal R/2. The process of comparing and adjusting the reference signal continues, depending on the precision required, until the appropriate digital number is determined. The pipeline system, achieves the successive approximation technique with cascaded stages starting with the most significant bit.

These processes are slow and cause delays in the system. In addition, while these do work electrically, they are not feasible for optical use.

SUMMARY OF THE INVENTION

Accordingly, it is an object of the present invention to provide an apparatus and method for optically converting an optical analog pulse width modulated signal into a digital code.

A further object of the present invention is to provide an apparatus and method for electrically converting an electrical analog pulse width modulated signal into a digital code.

Still another object of the present invention is to provide an apparatus and method for decreasing the time and power needed to make an A/D conversion.

Yet another object of the present invention is to provide an apparatus and method that is immune to voltage level sensitivities.

Yet another object of the present invention is to provide an apparatus and method that is immune to high speed ambiguities.

The above and other objects and advantages of the present invention are achieved by a particular embodiment which comprises an apparatus and method for converting an analog pulse-width modulated signal into a digital code.

A signal P is transmitted to an A/D converter having a series of pulse-width discriminating stages. Upon entering each stage, signal P is transmitted through a delay circuit creating a delayed signal P'. Signal P and P' are then combined to produce a combined signal if P and P' overlap, or no combined signal, if P and P' do not overlap. The combined signal operates a switch that opens one of two gate circuits. If a combined signal exists a gate is opened that allows the transmission of the combined signal to the next stage and a digital bit, B, is produced. If no combined signal is produced the switch opens the gate that allows signal P' to pass through to the next stage and no digital bit, B, is output.

A pulse-width discriminating A/D converter embodying the present invention requires only 8 stages to read 8 bits as opposed to 255 comparators and decoders for the flash conversion type.

A pulse-width discriminating A/D converter process embodying the present invention is also effective for optical as well as electrical signals. Optically a light signal, L, is transmitted through a delay circuit creating a delayed light signal, L'. Signals L and L' are then combined in optical gates (See Abraham, Seaton and Smith, *The Optical Computer*, Scientific American 85 (February, 1983)) as the electrical signals P and P' were above. This creates a combined signal which operates in the same manner as above.

DETAILED DESCRIPTION OF THE INVENTION

Figure 1:
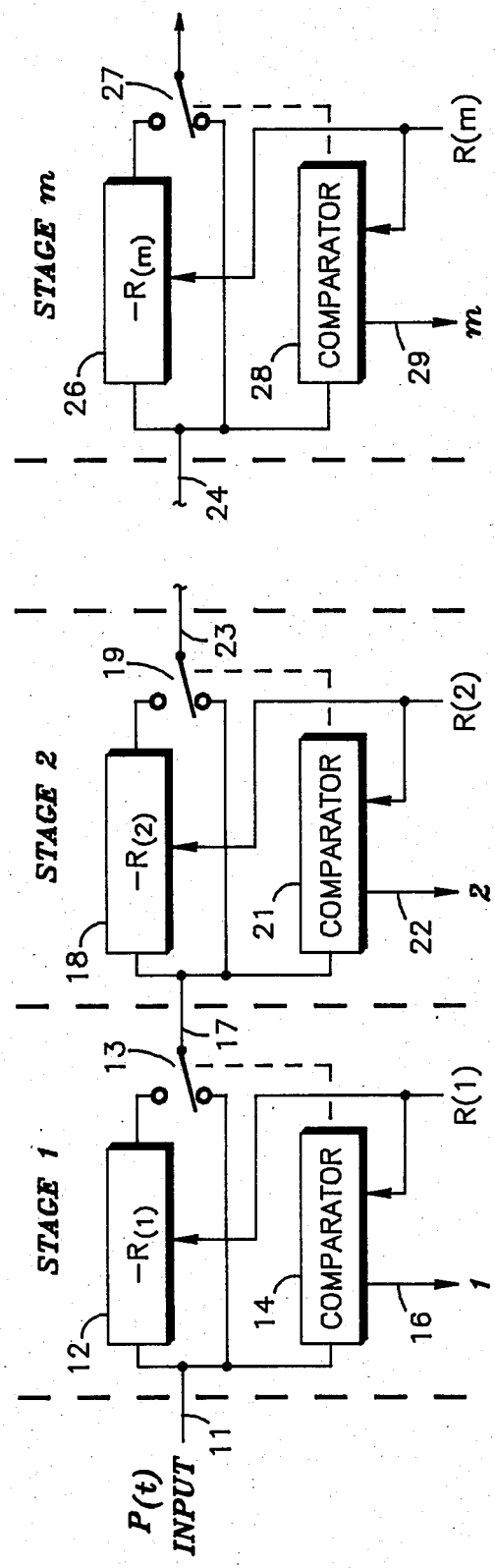
FIG. 1 is a block diagram of a pulse-width discriminating A/D converter embodying the present invention.

Referring to the block diagram of FIG. 1 a pulse width discriminating A/D converter, generally designated 10, embodying the present invention is illustrated. A standard duty cycle modulator precedes the present invention converting the analog signal into a pulse-width analog signal, P. Converter 10 consists of M stages, where M is the number of bits in a digital signal, D, to be determined from an initial pulse width analog signal, $P_{(I)}$. Each stage of converter 10 comprises a comparator, a subtractor and a switch controlled by the comparator. A signal $P_{(I)}$ of unknown width (or duration) is input along a line 11 which is connected to a subtractor 12, a switch 13 and a comparator 14. In comparator 14 signal $P_{(I)}$ is compared with a reference signal $R_{(1)}$, the width of which is determined by the equation:

$$R_{(1)} = T_c / 2^M \qquad (1)$$

where $T_c$ is the conversion interval of the circuit and M is the bit being determined.

If the width of $P_{(I)}$ is found to be greater than the width of $R_{(1)}$ then a bit number 1, not necessarily a bit of 1, of a signal D is output along a line 16 and comparator 14 operates switch 13 to connect subtractor 12 to a line 17. Subtractor 12 reduces signal $P_{(I)}$ by $R_{(1)}$ and the difference $(P_{(I)} - R_{(1)})$ is transmitted through switch 13 to line 17. If the width of $P_{(I)}$ is found to be less than the width of $R_{(1)}$ then no bit number 1 of signal D is output and comparator 14 operates switch 13 to connect line 11 to line 17. Signal $P_{(I)}$ is then transmitted to line 17, unchanged.

Line 17 carries a pulse width analog signal, $P_{(1)}$ from stage 1 to stage 2 and is connected to a subtractor 18, a switch 19 and a comparator 21. In comparator 21 signal $P_{(1)}$ is compared with a reference signal, $R_{(2)}$ for stage 2, determined by equation (1) above. If the width of signal $P_{(1)}$ is greater than the width of signal $R_{(2)}$ then a bit number 2 of signal D is output along a line 22 and comparator 21 operates switch 19 to connect subtractor 18 to a line 23. Subtractor 18 reduces signal $P_{(1)}$ by $R_{(2)}$ and the difference $(P_{(1)}-R_{(2)})$ is transmitted through switch 19 to line 23. If the width of $P_{(1)}$ is not greater than the width of $R_{(2)}$ then no bit number 2 of signal D is output and comparator 14 operates switch 19 to connect line 17 to line 23. Signal $P_{(1)}$ is then transmitted to line 23 unchanged.

Line 23 carries the pulse width analog signal $P_{(2)}$, from stage 2 to stage 3 (not shown). The area between line 23 and a line 24 is to illustrate that additional stages may be used if greater accuracy is desired. Line 24 carries a pulse width analog signal $P_{(M-1)}$ from stage $M-1$ (not shown) to stage M and is connected to a subtractor 26, a switch 27 and a comparator 28. In comparator 28 signal $P_{(M-1)}$ is compared with a reference signal, $R_{(M)}$, for stage M determined by equation (1) above. If the width of signal $P_{(M-1)}$ is greater than the width of signal $R_{(M)}$ then a bit number M of signal D is output on a line 29. Subtractor 26 reduces signal $P_{(M-1)}$ by $R_{(M)}$ and the difference $(P_{(M-1)}-R_{(M)})$ is transmitted through switch 27 and out of converter 10. If the width of $P_{(M-1)}$ is not greater than the width of $R_{(M)}$ then no bit number M of signal D is output and comparator 28 operates switch 27 to connect line 24 to the output of converter 10.

Figure 2:
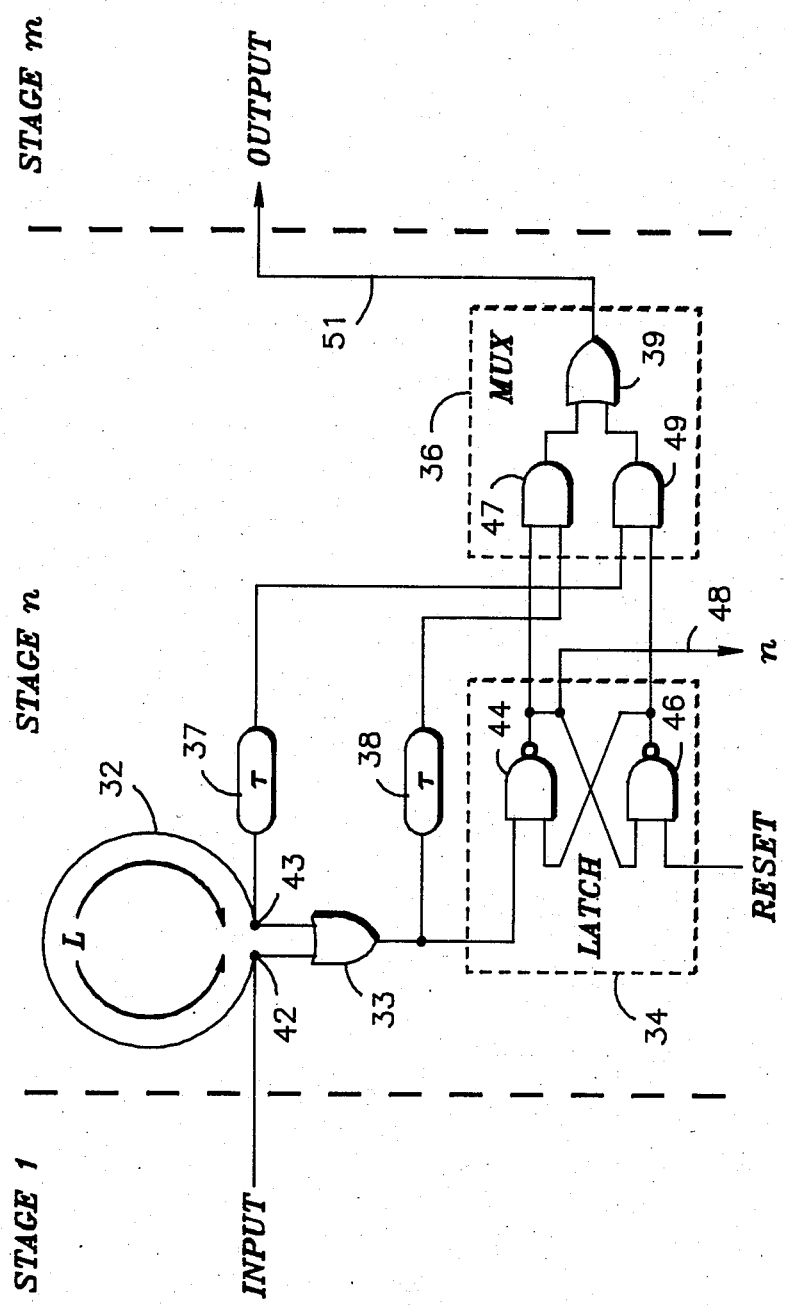
FIG. 2 is a schematic diagram of a single stage of the pulse-width discriminating A/D converter of FIG. 1.

Referring now to the schematic diagram of FIG. 2, a single stage, generally designated 31, of converter 10, FIG. 1, is illustrated. Stage 31 includes a delay loop 32, a dual input OR gate 33, a flip-flop 34, a multiplexer 36 and delays 37 and 38. Signal P is transmitted to a node 42 of stage 31. One end of delay loop 32 is connected to node 42 and a second end is connected to a node 43. Delay loop 42 is a physical distance L determined by the equation;

$$L = V_P(2^{m-n+2} T_T) \qquad (2)$$

Where $V_P$ is the propagation velocity of signal P; $T_T$ is the gate transition time of the material of loop 32; and n is the bit being determined where $M \geq n \geq 1$. Length L will be a different length for each stage, each subsequent stage being one-half the length of the previous stage. The time required for signal P to travel length L causes the delay needed. This type of delay has the advantage of being immune to voltage level sensitivities and high speed ambiguities. Loop 32 delays signal P by an interval equivalent to $R(n)$ producing a delayed signal P'.

Nodes 42 and 43, carrying signals P and P' respectively, are connected to the inputs of OR gate 33 where signals P and P' are ORed together. The output $(P+P')$ of gate 33 is connected to an input of a dual input NAND gate 44. The second input of NAND gate 44 is connected to the output of a dual input NAND gate 46. NAND gates 44 and 46 are interconnected in a well known manner to form flip-flop 34. NAND gate 44 produces an output which is connected to one input of NAND gate 46, an input of a dual input AND gate 47 of multiplexer 36 and a line 48 which outputs bit number n of signal D. The second input of NAND gate 46 is connected to a reset line and receives a reset signal. The reset signal resets flip-flop 34 once the operation has been completed. The output of NAND gate 46 is connected to an input of a dual input AND gate 49 of multiplexer 36. Multiplexer 36 is shown as having two AND gates 47 and 49.

In multiplexer 36, an input of AND gate 47 is coupled to the output of OR gate 33 through delay 38 which delays the combined signal $(P+P')$ long enough for flip-flop 34 to be set. AND gate 49 of multiplexer 36 has an input which is coupled to node 43 through delay 37 which delays signal P' long enough for OR gate 33 and flip-flop 34 to be set. The output from AND gates 47 and 49 are then ORed together in an OR gate 39 and the resulting signal is output to stage $n-1$ on a line 51.

Once bit n for the signal has been determined, flip-flop 34 is reset by the transmission of a reset signal to gate 46.

The above described process is repeated in subsequent stages, depending on the accuracy desired, for each bit to be determined.

Optically A/D converter 31 will function in the same manner as electrically. In this situation a fiber optic material will be used for conducting lines and optical logic gates (optical logic gates are disclosed in Abraham, Seaton and Smith, *The Optical Computer*, Scientific American 85 (February, 1983) at 91) will be used in place of the electrical logic gates. Once the signal enters stage n, FIG. 2, the same process occurs as in the electrical A/D converter. This process results in an optical digit, n, being output and an optical signal being transmitted to stage $n-1$.

Figure 3:
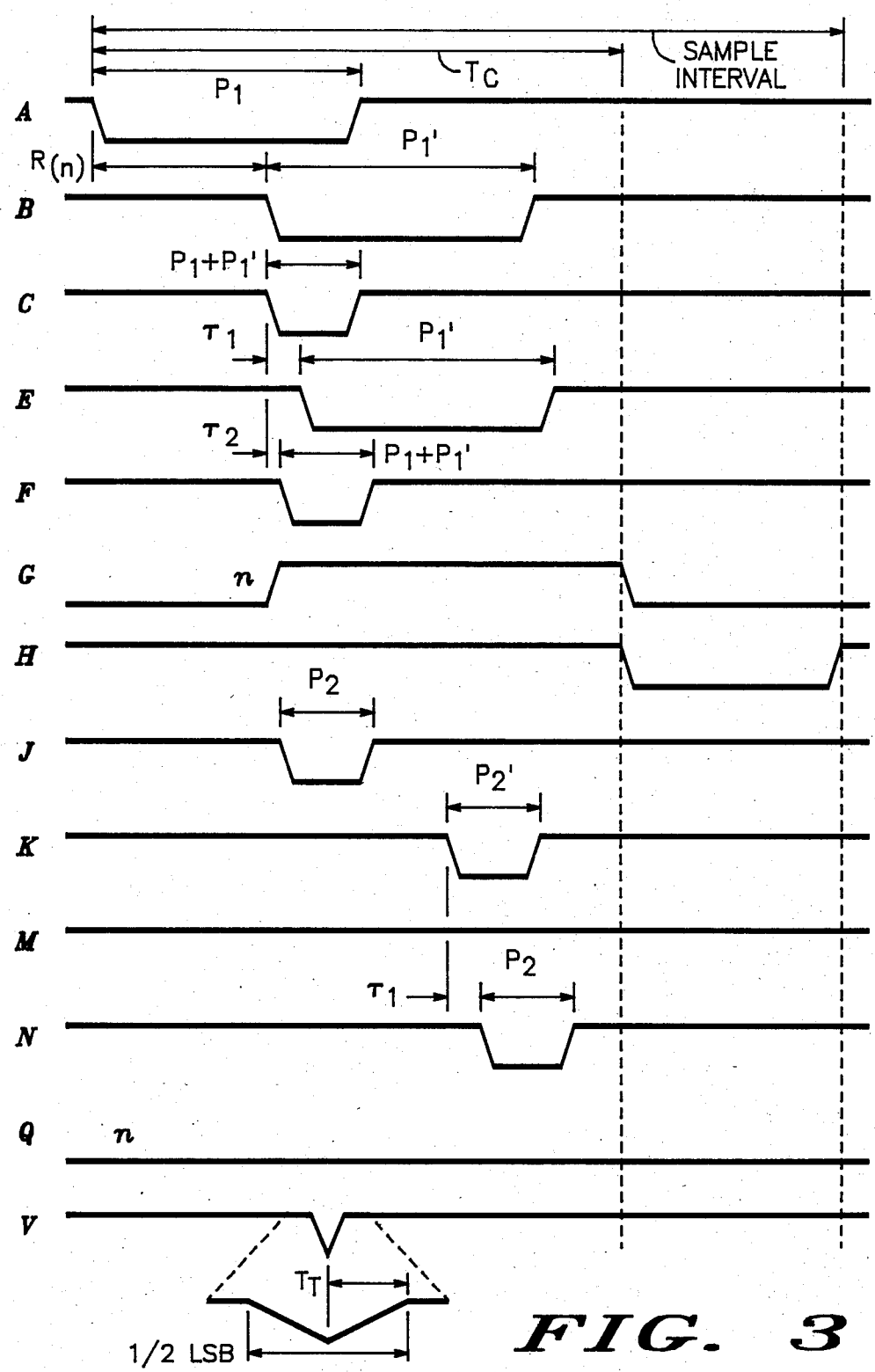
FIG. 3 is a timing diagram for the pulse-width discriminating A/D converter of FIG. 2.

Referring now to FIG. 3, the timing diagram for the pulse-width discriminating A/D converter of FIG. 2 is illustrated. Timing line A is the input signal $P_1$ that is carried to delay loop 32 and to OR gate 33. Timing line B is the input signal $P_1$ after it has travelled through delay loop 32 and becomes delay signal $P_1'$. Signal $P_1$ is delayed by delay interval $R_{(n)}$ that is equivalent to length L of delay loop 32 in FIG. 2. Timing line C is the combination of timing lines A and B $(P_1+P_1')$ and is also the output signal of OR gate 33 in FIG. 2. Signal $(P_1+P_1')$ is transmitted to gate 44 of flip-flop 34 and to delay 38 which delays signal $(P_1+P_1')$ by $t_2$, timing line F. Flip-flop 34 will then output a bit n of signal D, shown on timing line G, which enables gate 47 and inhibits gate 49 of multiplexer 36. While gate 47 is enabled signal $(P_1+P_1')$ from delay 38, timing line F, having been delayed for a time, $t_2$, long enough for flip-flop 34 to set multiplexer 36, passes through multiplexer 36. Signal $(P_1+P_1')$ from delay 37, timing line E, then travels through gate 47 to gate 39. OR gate 39 does not receive an input from AND gate 49 since gate 49 is inhibited by the output of flip-flop 34 and the output of delay 37, timing line E, will not pass through multiplexer 36. The resulting signal from gate 39 then passes along line 51 to stage $n-1$. Once the sample interval has passed, a reset signal shown on timing line H is transmitted to flip-flop 34 to reset gates 44 and 46.

A second signal $P_2$ is shown on timing line J, this signal, $P_2$, is shown to explain the operation of stage 31 when the input signal $(P_2)$ is shorter than the delay caused by loop 32. Signal $P_2$ is transmitted to delay loop 32 and to OR gate 33. Timing line K shows the input signal $P_2$ after it has travelled through delay loop 32 and becomes delay signal $P_2'$. Signal $P_2'$ is delayed by interval $R_{(n)}$ that is equivalent to length L of delay loop 32. Timing line M is the ORed signal $(P_2+P_2')$ from gate 33, which here has no signal since $R_{(n)}$ is greater than $P_2$. Since no signal is output from gate 33 to trigger gate 44 of flip-flop 34, gate 47 of multiplexer 36 is left inhibited and gate 49 is left enabled, in addition, no bit n, timing line Q, is output from stage 31. Multiplexer 36 then passes signal $P_2'$, timing line N, from delay 37, having been delayed long enough for flip-flop 34 to set multiplexer 36. Signal $P_2'$ then travels through OR gate 39. The resulting signal from gate 39 then passes along line 51 to stage n−1. Once the sampling interval has passed, a reset signal, timing line H, is transmitted to flip-flop 34, however, since gates 44 and 46 were not changed by signal $(P_2+P_2')$ the reset has no effect.

Figure 4:
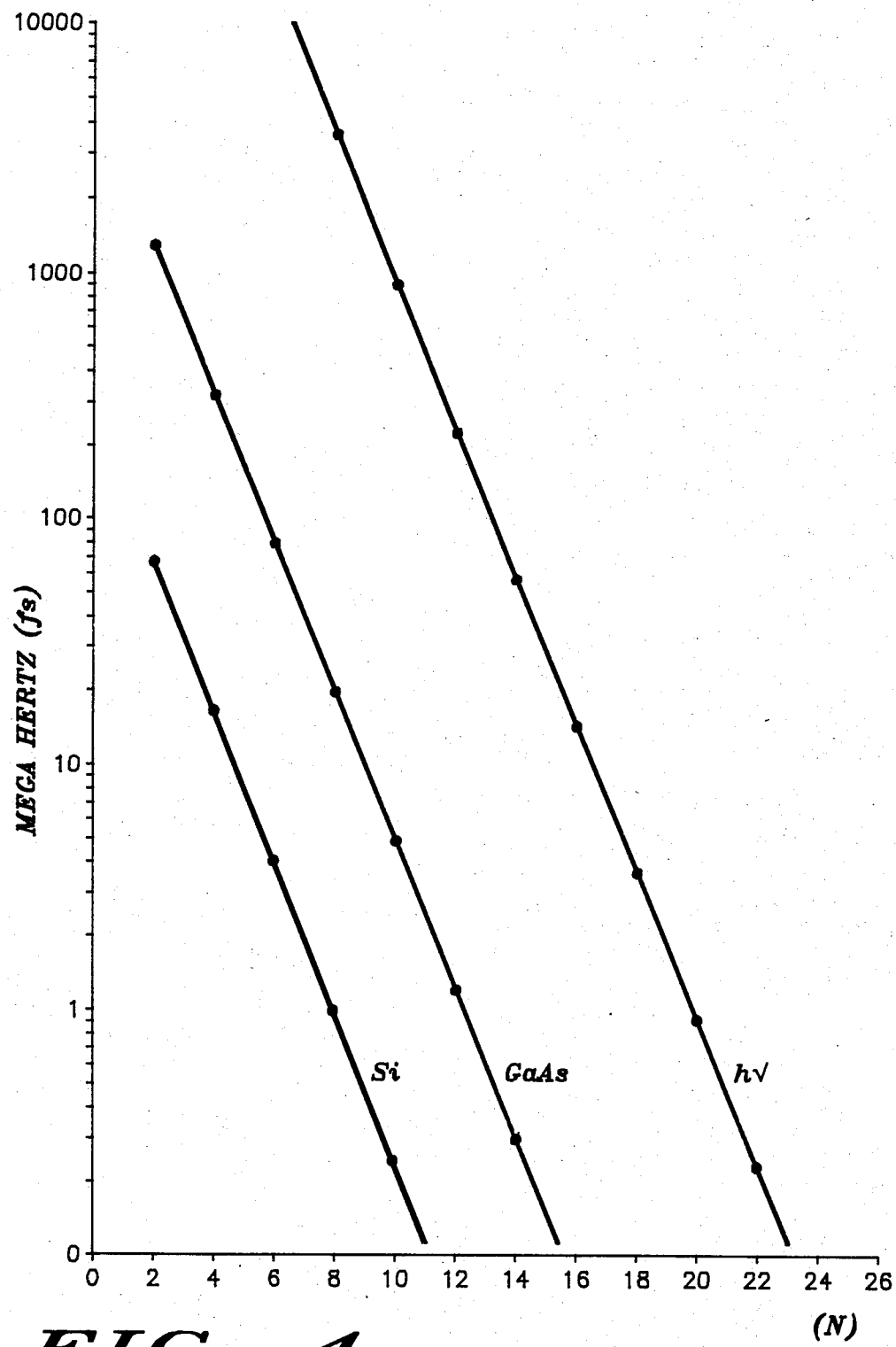
FIG. 4 is a graph of the frequency of the signal that can be used in a pulse width discriminating A/D converter embodying the present invention as a function of the number of bits to be read.

Timing line V of FIG. 3 shows the limiting case, or the smallest signal that may be sampled. This is determined by the transition time $T_T$ of the circuit derived from the equation;

$$T_T = 1/2^{M+2} f_s \tag{3}$$

Where M is the number of bits to be determined and $f_s$ is the frequency of signal P. The transition times, $T_T$, as a function of M, for logic gates formed from three different substances is illustrated in FIG. 4 where the ordinate is the frequency of signal P and the abscissa is the number of bits (M) in digital signal D. Of the three different substances two are for electrical transmissions, silicon (Si) and Gallium Arsenide (GaAs), and one for one optical, which is a fiber optic material (hv).

The transition time $T_T$ is inversely proportional to the frequency $f_s$ of signal P. The frequency, $f_s$, of signal P that is used in the different media is illustrated in FIG. 4 and may be determined by the above equation (3), which for M equal to 8 (an 8 bit A/D converter) would be approximately as follows.

|  | $T_T$ | $f_s$ |
|---|---|---|
| Si | 1 n sec | 1 MHz |
| GaAs | 50 p sec | 20 MHz |
| hv | .27 p sec | 3.6 GHz |

(numbers have been approximated for convenience)

The pulse-width discriminating A/D converter is therefore capable of operating at higher frequencies than that of other A/D converters.

Thus, it has been shown that the present invention will optically convert an optical analog pulse width signal into a digital signal.

It has been shown further, that the present invention electrically converts an electrical analog pulse width signal into a digital signal.

It has also been shown that the present invention decreases the time and power necessary to make the A/D conversion.

It has also been shown that the present invention is immune to voltage level sensitivities and high speed ambiguities.

Although specific logic circuit devices and circuit elements have been set forth in this specification, it is to be specifically understood that alternate logic elements and circuit elements having similar electrical characteristics may be substituted therefor.

While a preferred embodiment of the present invention has been disclosed and described, it will be obvious to those skilled in the art that various modifications and substitutions may be made without departing from the spirit of the invention and it is therefore intended that the appended claims cover all such modifications and substitutions.

I claim:

1. An A/D converter having a plurality of stages for converting an analog signal to a digital signal, each of said states having an analog input, a reset input, a digital output and an analog output, a stage of said A/D converter comprising:

a delay loop of a predetermined length for delaying said analog signal a predetermined amount of time equivalent to said predetermined length of said delay loop and creating a delayed signal, said delay loop having a first end and a second end, said first end being coupled to said analog input of said stage of said A/D converter;

combining means for combining said analog signal with said delayed signal creating a combined signal, said combining means including a first logic gate having a first input, a second input and an output, said first input being coupled to said first end of said delay loop and said second input being coupled to said second end of said delay loop;

selecting means for selecting one of said delayed signal and said combining signal and for providing said digital signal, said selecting means including a flip-flop having a first input, a second input, a first output and a second output, said first input being coupled to said output of said combining means, said second input being coupled to said reset input of said stage and said first output being coupled to said digital output of said stage; and gate means for passing one of said delayed signal and a portion of said delayed signal, said gate means comprising a multiplexer including first and second gates having a first input, a second input, a third input, a fourth input and first and second outputs and said multiplexer further including a second logic gate having first and second inputs coupled to the first and second outputs of said first and second gates, respectively, and an output, said gate means being controlled by said selecting means to allow one of said delayed signal and said combined signal to pass through said gate means, said first input of said gate means being coupled to a first output of said selecting means, said second input of said gate means being coupled to said output of said combining means through a second delay gate, said third input of said gate means being coupled to said second end of said delay loop through a first delay gate, said fourth input of said gate means being coupled to said second output of said selecting means and said output of said second logic gate coupled to said analog output of said stage.

2. An A/D converter for converting an analog signal to a digital signal which comprises a plurality of stages, each stage having an analog input, a reset input, an analog output, a digital output, and each stage further comprising:

a delay loop of predetermined length having a first end and a second end, said first end being coupled to said analog input of said stage of said A/D converter;

a first logic gate having a first input, a second input and an output, said first input being coupled to said first end of said delay loop and said second input being coupled to said second end of said delay loop;

a flip-flop having a first input, a second input, a first output and a second output, said first input of said flip-flop being coupled to said output of said first logic gate, said second input of said flip-flop being coupled to said reset input and said first output of said flip-flop being coupled to said digital output;

a multiplexer having a first gate and a second gate, said first gate and said second gate each having a first input, a second input, and an output, said first input of said first gate of said multiplexer being coupled to said first output of said flip-flop, said second input of said first gate of said multiplexer being coupled to said output of said first logic gate through a second delay, said first input of said second gate of said multiplexer being coupled to said second end if said delay loop through a first delay, and said second input of said second gate of said multiplexer being coupled to said second output of said flip-flop; and a second logic gate having a first input, a second input and an output, said first input of said second logic gate being coupled to said output of said first gate of said multiplexer, said second input of said second logic gate being coupled to said output of said second gate of said multiplexer and said output of said second logic gate being coupled to said analog output of said stage of said A/D converter.

3. The A/D converter of claim 2 wherein said first logic gate combines said analog signal with a delayed analog signal from said delay loop to produce a combined signal, said combined signal being transmitted to said first input of said flip-flop.

4. The A/D converter of claim 3 wherein said flip-flop further comprises a first state and a second state, said first state enabling said second gate of said multiplexer allowing said delayed signal to pass through said multiplexer to said second logic gate and inhibiting said first gate of said multiplexer, said second state being activated by said combined signal from said output of said first logic gate, said combined signal enabling said first gate of said multiplexer allowing said combined signal to pass through said multiplexer to said second logic gate and inhibiting said second gate of said multiplexer.

* * * * *